United States Patent [19]

Yu et al.

[11] Patent Number: 5,147,819

[45] Date of Patent: Sep. 15, 1992

[54] SEMICONDUCTOR METALLIZATION METHOD

[75] Inventors: Chang Yu; Trung T. Doan; Gurtej S. Sandhu, all of Boise, Id.

[73] Assignee: Micron Technology, Inc., Boise, Id.

[21] Appl. No.: 659,866

[22] Filed: Feb. 21, 1991

[51] Int. Cl.$^5$ .............................................. H01L 21/26
[52] U.S. Cl. ..................................... 437/173; 437/188;
437/197; 437/942; 148/DIG. 20; 148/DIG. 93
[58] Field of Search ............... 437/173, 188, 197, 942;
148/DIG. 93, DIG. 20

[56] References Cited

U.S. PATENT DOCUMENTS

| | | | |
|---|---|---|---|
| 3,413,157 | 11/1968 | Kuiper | 437/197 |
| 4,042,954 | 8/1977 | Harris | 437/197 |
| 4,660,062 | 4/1987 | Nishizawa | 357/23.3 |
| 4,923,526 | 5/1990 | Harada | 437/194 |

FOREIGN PATENT DOCUMENTS 87747  4/1988  Japan .................................. 437/197

OTHER PUBLICATIONS

H. Ono, et al "Development of a Planarized Al-Si Contact Filling Technology" Proc. 1990 VMIC, Jun. 1990 pp. 76–82.

*Primary Examiner*—Brian E. Hearn
*Assistant Examiner*—Linda J. Fleck
*Attorney, Agent, or Firm*—Wells, St. John & Roberts

[57] ABSTRACT

A method of applying an alloy layer of predetermined thickness on a semiconductor wafer to fill contact openings having a defined diameter, the method comprising the following steps:

chemical vapor depositing (CVD) a layer of elemental metal atop the wafer to a thickness of from 5% to 35% of the defined contact diameter;

sputtering a layer of an alloy atop the chemical vapor deposited layer of elemental metal to a thickness which results in the combination of the chemical vapor deposited and sputtered layers having substantially the predetermined overall layer thickness; and combining and intermixing the sputtered alloy layer with the chemical vapor deposited elemental metal layer to form an overall homogenous alloy layer by applying energy to the sputtered alloy layer, the application of energy also filling contact openings and planarizing the homogenous layer.

Preferably, the CVD layer has a thickness of from 10% to 20%, and the energy is applied by a scanning pulsed laser.

4 Claims, 1 Drawing Sheet

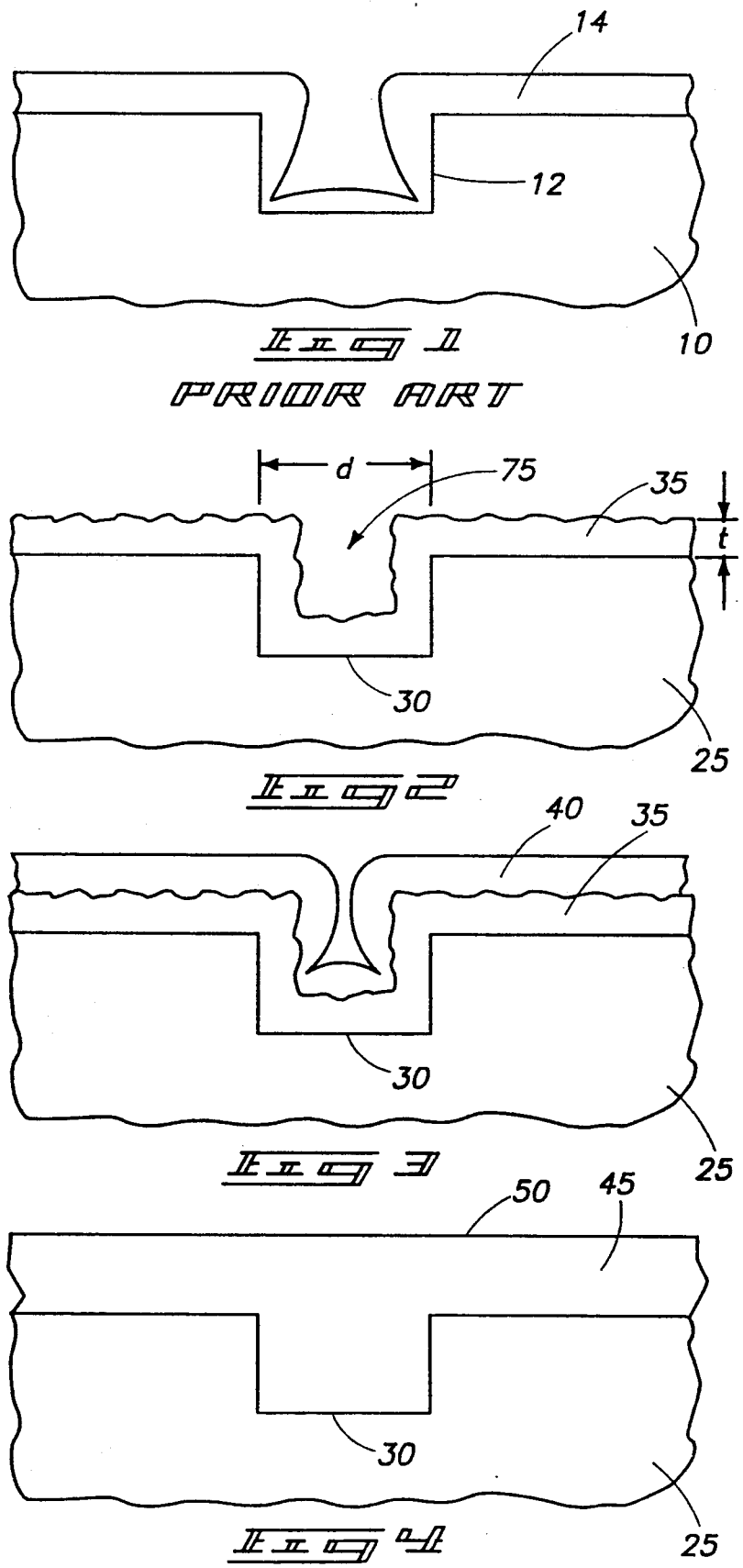

SEMICONDUCTOR METALLIZATION METHOD

TECHNICAL FIELD

This disclosure relates generally to metallization of integrated circuits, and more particularly to improvements in contact hole/via filling with conductive metal films.

BACKGROUND OF THE INVENTION

In the metallization step utilized preparatory to etching of conductors about the outer surfaces of integrated circuits, step-coverage of conductive metal films (typically aluminum or aluminum alloys) is poor over surface discontinuities, such as recesses and contact holes/vias. The problem becomes progressively worse as the dimensions of the integrated circuit components shrink. Poor step coverage is the result of the shadow effect in the deposited film at the sidewalls of the steps or holes, and is illustrated with reference to FIG. 1. A semiconductor wafer fragment 10 is illustrated with a contact opening or via 12. A metallized layer 14 of aluminum or its alloys has been sputtered atop wafer fragment 10. As is apparent, sputtered layer 14 does not completely nor adequately fill contact opening 12, which is an inherent drawback in sputtered metal films.

Poor step coverage can be overcome to some degree by selective chemical vapor deposition (CVD) of tungsten or other elements, by a chemical vapor deposition using high temperature and/or bias sputtering, or by supplemental metal deposition using multiple alternation sequences involving a combination of evaporation and re-sputtering. However, improvements in step coverage from such methods are achieved at the expense of several drawbacks. For example, high temperature and/or bias sputtering results in poor film quality in terms of surface morphology, electromigration lifetime (for bias sputtering) and increased argon incorporation. Regarding CVD of tungsten, the resulting film resistivity is about three times higher than that of aluminum or aluminum alloys. CVD technology has the general drawbacks of high cost, poor surface morphology and film qualities (especially true with aluminum). Alloy material interconnects, especially where the primary constituent is aluminum, are preferred to minimize junction spiking and electron migration which can lead to circuit failure in operation. CVD is described generally in "Silicon Processing For The VLSI Era", (Vol. 2-Process Integration), by S. Wolf, published 1990 by Lattice Press, Sunset Beach, Calif., at Section 4.5., which is hereby incorporated by reference.

Planarization of conductive films is one method of obtaining improved step coverage of sputtered films, as compared to the as-deposited film quality. Such can be conducted with rapid thermal processing (RTP) or with the use of laser energy. Rapid thermal processing typically employs lamps which rapidly heat the metallized surface, causing it to melt. During the molten period, mass transport of the conductive metal occurs which results in flow of the metal completely into the contact holes/vias. As well, the film surface is driven flat due to the high surface tension and low viscosity of molten metals. However, RTP has the drawback of potentially damaging the underlying substrate because of the heating time required to cause the desired flow. This is one reason that laser planarization is preferred over RTP.

Laser planarization achieves the same effect as RTP by impinging laser energy on the metallized surface to cause the melting and flow. The use of continuous or pulse lasers to melt and planarize thin aluminum films to fill high aspect ratio contact holes/vias is an attractive approach to Ultra Large Scale Integration (ULSI) circuit metallization. It is a low thermal budget, simple, and effective technique for planarizing metal layers and filling inter-level contacts at the cost of only one additional step to the standard process flow.

The technique of laser planarization has shown promise in improving step coverage of aluminum alloy films in micron/submicron geometry contacts and contact vias. However, laser planarization of aluminum in particular is not without drawbacks. First, aluminum is a highly reflective metal which reflects approximately 93% of wavelengths in the region down to 200 nm. Accordingly, aluminum reflects a significant amount of laser energy which results in inefficiency.

Second, laser planarization is typically conducted in an evacuated chamber at very low, vacuum-like pressures. The intent is to eliminate oxygen to avoid degradation reactions which would otherwise occur during the process. Typical pressures within the laser planarization chambers are between $10^{-9}$ to $10^{-7}$ atmospheres. Under these conditions, the vaporization/boiling temperatures of aluminum are 1632° C. and 1782° C., respectively. Accordingly, care must be exercised to assure that the applied laser energy will not raise the temperature of the aluminum film above the 1632° C. to 1782° C. vaporization temperature, which would cause the aluminum from the applied surface to ablate from the surface.

On the other hand, the applied energy must be at least sufficient to cause aluminum melting to achieve the desired step coverage/planarization effect. Because of aluminum's high reflectivity, however, this minimum amount of energy is pushed higher as a significant amount is reflected away. Accordingly, the range between the applied energy to avoid ablation and to achieve adequate melting is very narrow. This window range is typically referred to as the "process window". In production, conditions must be maintained within this window to achieve suitable results. The closer the melting temperature and ablation temperature are to one another, the narrower the process window and accordingly the more tedious and difficult production becomes.

Accordingly, neither CVD nor sputtering followed by laser planarization techniques produce the most desired results.

BRIEF DESCRIPTION OF THE DRAWINGS

Preferred embodiments of the invention are described with reference to the accompanying drawings, in which:

FIG. 1 is a diagrammatic sectional view of a substrate wafer fragment and is described in the Background Section above.

FIG. 2 is a diagrammatic sectional view of a substrate wafer fragment at a processing step in accordance with the invention.

FIG. 3 is a diagrammatic sectional view of a substrate wafer fragment at a processing step subsequent to that illustrated by FIG. 2 using a processing method in accordance with the invention.

FIG. 4 is a diagrammatic section of a substrate wafer fragment at a processing step subsequent to that illustrated by FIG. 3 using a processing method in accordance with the invention.

DETAILED DESCRIPTION OF THE PREFERRED EMBODIMENTS

The following disclosure of the invention is submitted in furtherance with the constitutional purpose of the U.S. Patent Laws "to promote the progress of science and useful arts" (Article 1, Section 8).

In accordance with the invention, a method of applying an alloy layer of predetermined thickness on a semiconductor wafer to fill contact openings having a defined diameter comprises the following steps:
chemical vapor depositing (CVD) a layer of elemental metal atop the wafer to a thickness of from 5% to 35% of the defined contact diameter;
sputtering a layer of an alloy atop the chemical vapor deposited layer of elemental metal to a thickness which results in the combination of the chemical vapor deposited and sputtered layers having substantially the predetermined overall layer thickness; and
combining and intermixing the sputtered alloy layer with the chemical vapor deposited elemental metal layer to form an overall homogenous alloy layer by applying energy to the sputtered alloy layer, the application of energy also filling contact openings and planarizing the alloy homogenous layer.

The invention will have specific applicability to chemical vapor depositing layers of elemental aluminum, followed by sputtering to form a second layer of an aluminum alloy. Where contact openings on the wafer are of differing sizes, the film thickness of the CVD metal is preferably determined relative to the widest open dimension of the smallest contact opening. The invention has not been reduced to practice at this writing.

More particularly, FIG. 2 illustrates a wafer fragment 25 having a contact opening 30 provided therein. Contact 30 has a defined longest open dimension, or diameter, "d". A layer 35 of elemental metal is illustrated as having been chemical vapor deposited atop the wafer to a thickness "t". Thickness "t" should be sufficiently less than 50% to provide an open space 75 within contact opening 30 after the vapor deposition. A "t" thickness from 5% to 35% of dimension "d" is desirable, and most preferably from 10% to 20% of dimension "d".

Following chemical vapor deposition of layer 35, an alloy layer 40 is sputtered atop layer 35 (FIG. 3) to a thickness which results in the combination of the chemical vapor deposited and sputtered layers having substantially the predetermined overall thickness for the overall alloy layer. As illustrated in FIG. 3, step coverage of sputtered layer 40 within contact opening 30 is improved somewhat from that of the prior art, but is not complete.

Energy is then applied to wafer 25, and to sputtered alloy layer 40 in particular, to melt layer 40 into layer 35. This will cause layers 40 and 35 to combine and intermix to form an overall homogenous layer 45, as shown in FIG. 4. This will also completely fill contact opening 30 and provide alloy homogenous layer 45 with a flat upper planarized surface 50. The energy can be applied by rapid thermal processing, such as by example using tungsten lamps under low vacuum-like pressure conditions and with short one to five second heating cycles. More preferably, the energy would be applied by using a pulse excimer laser to melt and planarize the upper surface and drive the metal completely into the contacts.

The above described processes have significant advantages over those of the prior art. The initial chemical vapor deposited layer provides excellent step coverage as compared to a sputtered metal layer. As well, the subsequently sputtered layer is much thinner than conventional sputtered layers. This serves to lower the amount of energy required to melt the sputtered layer to cause it to melt into the lower CVD layer. Reducing the amount of required energy in this manner effectively widens the planarization process window by enabling the laser fluence to be more removed (lowered) from the ablation point. Accordingly, unintended ablation is less likely.

With respect to aluminum, the metallized film quality is greatly improved as compared to CVD aluminum. There is also the advantage of incorporating other elements into the aluminum.

As will be immediately appreciated by those of skill in the art, silicide layers and/or barrier metal layers would most probably be provided first atop wafer 25 before the CVD and sputter applications. For example, a thin layer of titanium could be applied atop the wafer first, with subsequent heating to form a titanium silicide with the underlying wafer material for increasing conduction and thereby reducing contact resistance. The unreacted titanium would then be etched away. A barrier layer, such as TiW, could then be applied to minimize junction spiking, as is well known within the art. The CVD layer could then be applied atop the barrier layer.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. In a sputtering process of forming an aluminum alloy layer of predetermined thickness on a semiconductor wafer to improve step coverage by filling contact openings which have a defined diameter, a method of lowering required laser fluence and widening the laser planarization process window in achieving a desired planarization effect, the method comprising the following sequential steps:
chemical vapor depositing a layer of elemental aluminum atop the wafer to a thickness of from 5% to 35% of the defined contact diameter;
sputtering a layer of an aluminum alloy atop the chemical vapor deposited layer of elemental aluminum to a thickness which results in the combination of the chemical vapor deposited and sputtered layers having substantially the predetermined overall layer thickness; and
combining and intermixing the sputtered aluminum alloy layer with the chemical vapor deposited aluminum layer to form an overall homogenous aluminum alloy layer by applying laser energy to the sputtered aluminum alloy layer, the application of energy also filling contact openings and planarizing the overall homogenous alloy layer, the sequential steps of applying CVD aluminum to 5% to 35% of the contact diameter and sputtering the aluminum alloy effecting a lowering of required laser fluence and a widening of the laser planarization process window than would otherwise be required for planarizing a sputtered aluminum alloy layer.

2. The method of applying an aluminum alloy layer of claim 1 comprising chemical vapor depositing a layer of elemental aluminum atop the wafer to a thickness of from 10% to 20% of the defined contact diameter.

3. In an alloy sputtering process in the processing of semiconductor wafers to improve step coverage by filling contact openings which have a defined diameter, a method of lowering required laser fluence and widening the laser planarization process window in achieving a desired planarization effect, the method comprising the following sequential steps:

chemical vapor depositing a layer of elemental metal atop the wafer to a thickness of from 5% to 35% of the defined contact diameter;

sputtering a layer of an alloy atop the chemical vapor deposited layer of elemental metal to a thickness which results in the combination of the chemical vapor deposited and sputtered layers having substantially the predetermined overall layer thickness, the alloy having the elemental metal as an alloy component; and combining and intermixing the sputtered alloy layer with the chemical vapor deposited elemental metal layer to form an overall homogenous alloy layer by applying laser energy to the sputtered alloy layer, the application of laser energy also filling contact openings and planarizing the overall homogenous alloy layer, the sequential steps of applying CVD elemental metal to 5% to 35% of the contact diameter and sputtering the alloy effecting a lowering of required laser fluence and a widening of the laser planarization process window than would otherwise be required for planarizing a sputtered alloy layer.

4. The method of claim 3 comprising chemical vapor depositing a layer of elemental metal atop the wafer to a thickness of from 10% to 20% of the defined contact diameter.

* * * * *